(12) United States Patent
Li et al.

(10) Patent No.: US 7,746,643 B2
(45) Date of Patent: Jun. 29, 2010

(54) HEAT SINK ASSEMBLY WITH A LOCKING DEVICE

(75) Inventors: Hao Li, Shenzhen (CN); Jun Long, Shenzhen (CN); Tao Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 284 days.

(21) Appl. No.: 11/831,930

(22) Filed: Jul. 31, 2007

(65) Prior Publication Data
US 2009/0034205 A1 Feb. 5, 2009

(51) Int. Cl.
*H05K 7/20* (2006.01)
*H01L 23/34* (2006.01)
*H01L 23/26* (2006.01)
*A44B 21/00* (2006.01)

(52) U.S. Cl. ............... 361/704; 361/709; 361/719; 257/719; 174/16.3; 165/80.3; 165/185; 24/458; 24/459; 248/510

(58) Field of Classification Search ............... 361/704, 361/709–710, 718–719; 257/718–719; 174/16.1, 174/16.3, 252, 548; 165/80.2, 80.3, 185; 24/458, 459, 520; 248/510
See application file for complete search history.

(56) References Cited
U.S. PATENT DOCUMENTS
5,464,054 A 11/1995 Hinshaw et al.
6,160,709 A * 12/2000 Li .................. 361/704
6,344,971 B1 * 2/2002 Ju .................. 361/704
6,822,869 B2 * 11/2004 Huang et al. ............... 361/704
6,934,157 B2 * 8/2005 Figuerado et al. .......... 361/704
7,515,419 B2 * 4/2009 Li et al. ................... 361/704
2005/0128708 A1 * 6/2005 Barsun et al. .............. 361/704
2005/0286233 A1 * 12/2005 Lin et al. .................. 361/719
2006/0042783 A1 * 3/2006 Hsu ...................... 165/80.3

FOREIGN PATENT DOCUMENTS
CN 2567928 Y 8/2003

* cited by examiner

*Primary Examiner*—Zachary M Pape
(74) *Attorney, Agent, or Firm*—Frank R. Niranjan

(57) ABSTRACT

A heat sink assembly includes a heat sink having a first shoulder and a second shoulder, and a locking device having a retention module, a first clip and a second clip. The first clip has two extension portions engaging with the retention module and a pressing portion between the two extension portions. The second clip comprises a pressing portion located on the second shoulder, an axle connecting with the pressing portion and pivotably engaging with the retention module and a locking portion connecting with the pressing portion. The second clip can rotate around the axle thereof when the heat sink assembly is in an unlocked position; the locking portion engages with the retention module and the pressing portion presses the second shoulder of the heat sink toward the retention module when the heat sink assembly is in a locked position.

13 Claims, 6 Drawing Sheets

HEAT SINK ASSEMBLY WITH A LOCKING DEVICE

BACKGROUND OF THE INVENTION

1. Field of the Invention

The present invention relates generally to a heat sink assembly with a locking device, and more particularly to a heat sink assembly with a locking device for securing a heat sink to a heat-generating electronic device.

2. Description of Related Art

It is well known that heat is produced during operation of electronic devices such as central processing units (CPUs). The heat produced must be quickly removed to ensure normal operation of the CPU. Typically, a heat sink assembly is used to remove heat from the CPU.

Conventionally, a heat sink assembly comprises a heat sink and a locking device for secure the heat sink to an electronic device. The locking device generally comprises a retention module around the electronic device and a clip matching with the retention module to keep the heat sink in intimate contact with the electronic device. An example of a related heat sink assembly is disclosed in U.S. Pat. No. 5,464,054. The related heat sink assembly comprises a wire clip fastening a heat sink onto an electronic device. The wire clip comprises a central portion and two fastening portions extending from two opposite ends of the central portion, respectively. The heat sink comprises a base and a plurality of fins extending upwardly from the base. A longitudinal slot is defined in the base. The central portion of the wire clip is retained in the slot. End portions of the fastening portions engage with corresponding tabs extending from opposite sidewalls of the retention module, thereby resiliently securing the heat sink to the electronic device. However, it is awkward and difficult to manipulate the wire clip to mount the heat sink to the electronic device; furthermore, subjected to vibration or shock during use, the clip is prone to rotate in a plane that is parallel to the base and is prone to move along an extending direction of the slot. This can adversely affect thermal engagement of the heat sink with the electronic device.

What is needed therefore is a heat sink assembly with a locking device which can conveniently and stably secure a heat sink to a heat generating electronic device.

SUMMARY OF THE INVENTION

A heat sink assembly in accordance with a preferred embodiment of the present invention includes a heat sink having a first shoulder and a second shoulder extending laterally and oppositely from a base of the heat sink, and a locking device. The locking device includes a retention module, a first clip and a second clip. The first clip has two extension portions at two ends thereof and engaged with the retention module, and a pressing portion between the two extension portions. The second clip comprises a pressing portion located on the second shoulder of the heat sink, an axle connecting with the pressing portion and pivotably engaging with the retention module and a locking portion connecting with the pressing portion. The second clip can rotate around the axle thereof. The locking portion engages with the retention module and the pressing portion presses the second shoulder of the heat sink toward the retention module when the heat sink assembly is in a locked position.

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
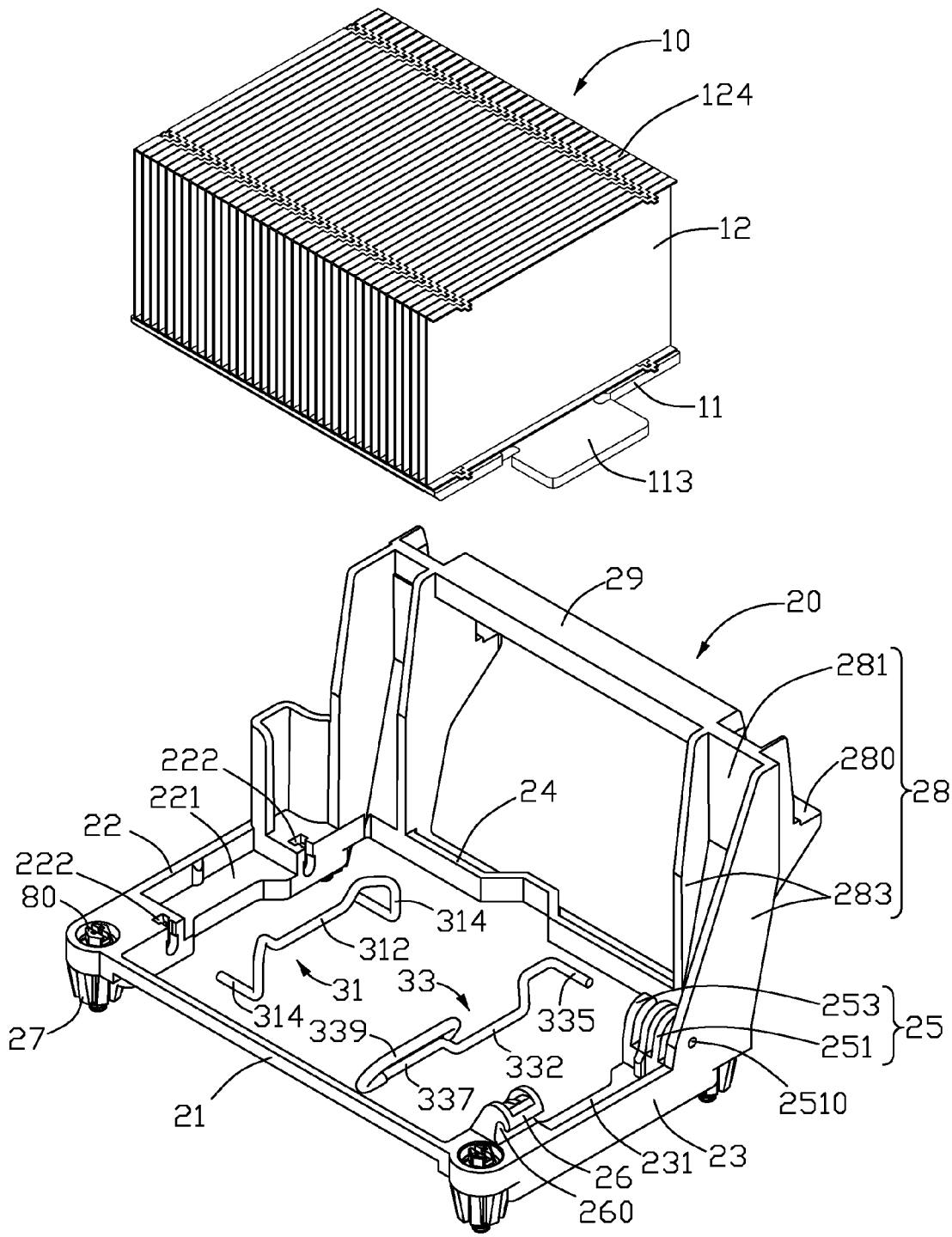
FIG. 1 is an exploded view of a heat sink assembly with a locking device in accordance with a preferred embodiment of the present invention.
Figure 2:
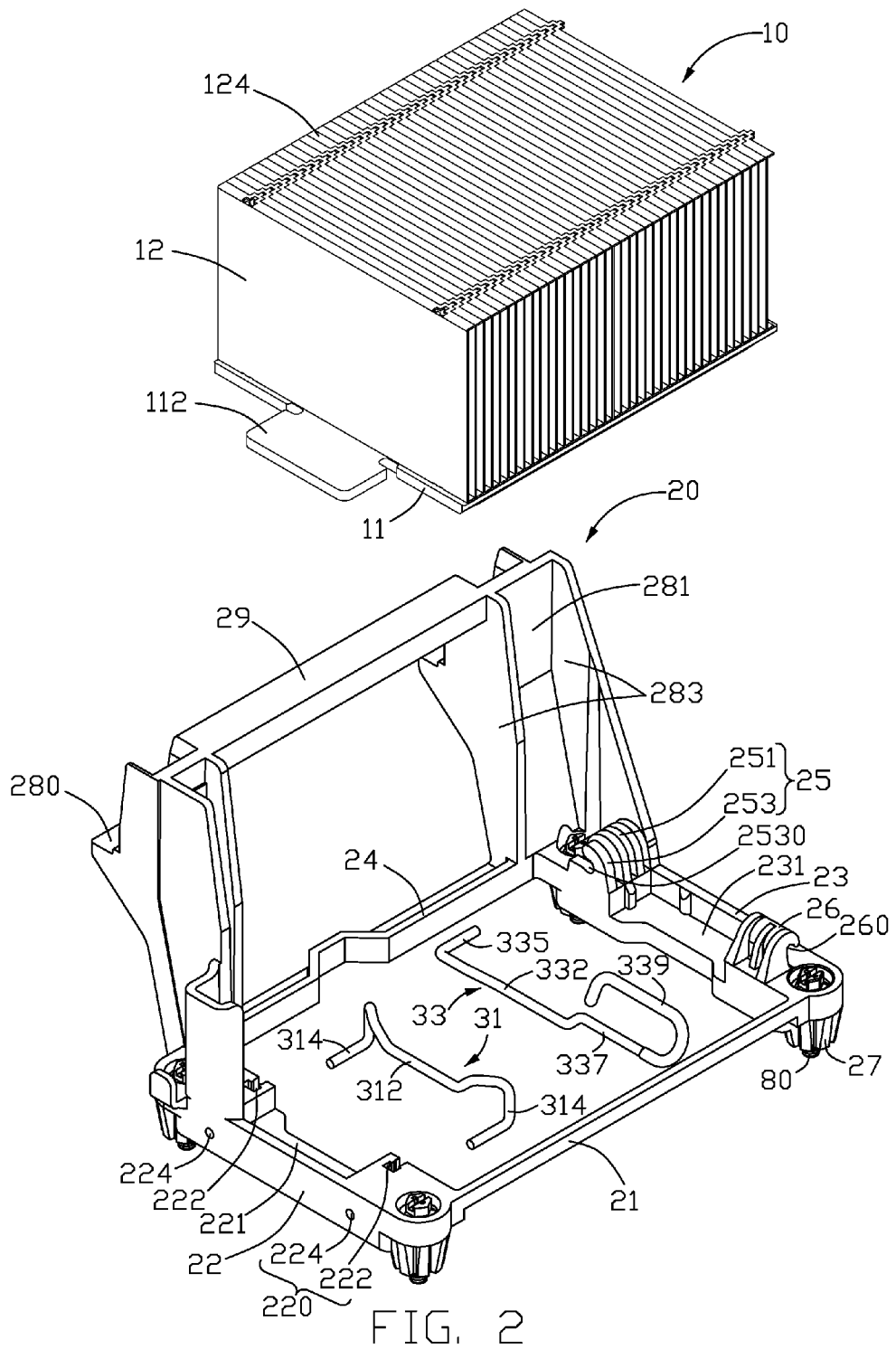
FIG. 2 shows the heat sink assembly with a locking device of FIG. 1 from another aspect.

Referring to FIGS. 1-2, a heat sink assembly with a locking device in accordance with a preferred embodiment of the present invention comprises a heat sink 10, a retention module 20, a wire-made, first clip 31 and a wire-made, second clip 33 cooperating with the retention module 20 to secure the heat sink 10 to an electronic component (not shown) located on a printed circuit board (not shown).

The heat sink 10 comprises a base 11 and a plurality of fins 12 perpendicularly arranged on the base 11. The base 11 is an approximately rectangular metal plate having good heat conductivity. The base 11 extends two shoulders 112, 113 from central portions of two opposite lateral sides thereof. Each fin 12 is substantially rectangular and made from a metal sheet. Each fin 12 extends two sets of flanges 124 perpendicularly from top and bottom edges thereof for spacing adjacent fins 12. The fins 12 are soldered on the base 11, and the shoulders 112, 113 of the base 11 extend beyond the fins 12.

The retention module 20 is a substantially rectangular frame and comprises four interconnecting sidewalls 21, 22, 23, 24 located around the CPU. Two opposite sidewalls 22, 23 each define a rectangular recess communicating with an inner periphery thereof to form a receiving portion 221, 231 for receiving the shoulders 112, 113 of the heat sink 10. The sidewall 22 defines two receiving spaces 220 at two lateral sides of the receiving portion 221 for engagingly receiving the first clip 31. Each receiving space 220 comprises a vertical hole 222 and a horizontal hole 224 perpendicularly communicating with the vertical hole 222 so as to form an L-shaped configuration. The sidewall 23 upwardly extends a seat 25 and a block 26 at two lateral sides of the receiving portion 231. The seat 25 comprises a pivotal seat 251 and a stopper 253 at a front end of the pivotal seat 251. The pivotal seat 251 defines a hole 2510 at a center thereof and the stopper 253 defines a groove 2530 corresponding to the hole 2510. The block 26 has an inverted hook structure and defines a retaining slot 260. Four hollow locking feet 27 extend downwardly from four corners of the retention module 20. Each locking foot 27 defines a through hole (not shown) therein. Four screws 80 extend through the holes of the locking feet 27 and the printed circuit board to engage with a back plate (not shown) mounted below the printed circuit board for securing the retention module 20 to the printed circuit board.

Figure 6:
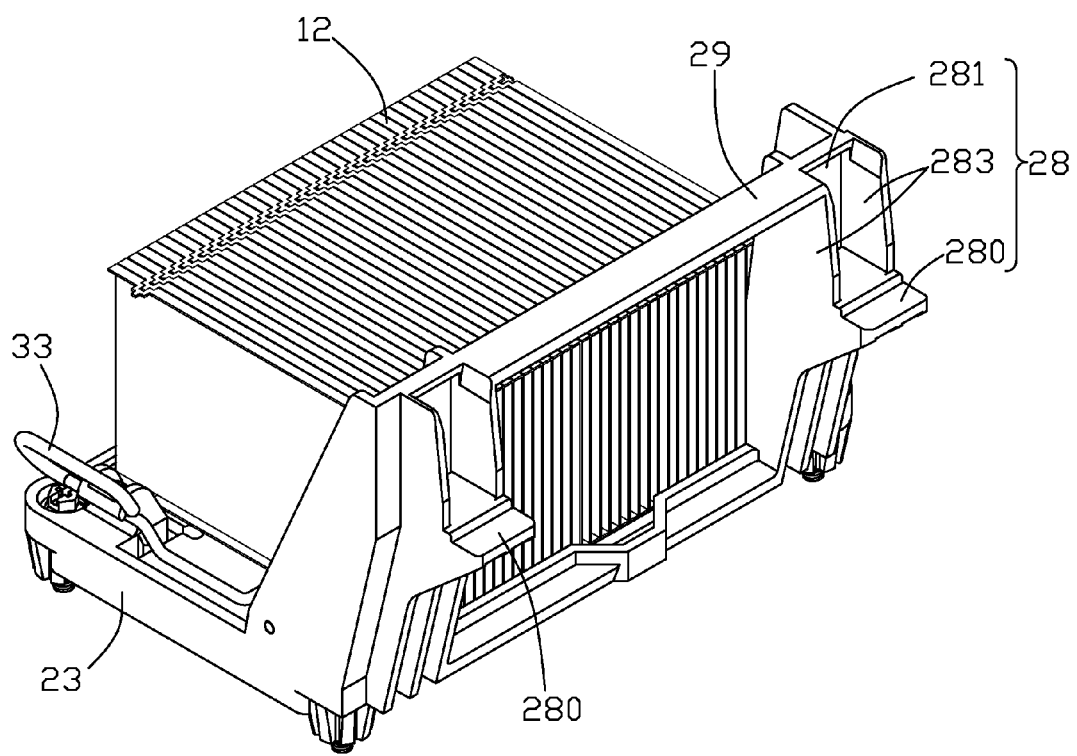
FIG. 6 shows the heat sink assembly with a locking device of FIG. 4 from still another aspect.

Referring also to FIG. 6, two supporting racks 28 extend upwardly from two ends of the sidewall 24, and a beam 29 connects with two upper ends of the supporting racks 28. Each supporting rack 28 comprises a vertical base plate 281 and two parallel ribs 283 vertically connecting with the base plate 281 and the sidewalls 22, 23, 24. A supporting platform 280 extends from an upper portion of each supporting rack 28 and connecting with the base plates 281 and the ribs 283. The two supporting platforms 280 of the supporting racks 28 are used for corporately supporting other electronic device thereon, such as a hard disk driver (not shown).

Referring again to FIGS. 1-2, the first clip 31 and the second clip 33 each are made from a metal wire. The first clip 31 comprises a middle U-shaped pressing portion 312 and two L-shaped extension portions 314 extending perpendicularly and downwards from free ends of the pressing portion 312. The extension portions 314 are received in the receiving spaces 220 of the sidewall 22. The second clip 33 comprises a U-shaped pressing portion 332, an axle 335 extending perpendicularly from a free end of the pressing portion 332, a liner locking portion 337 extending from another free end of the pressing portion 332 and a P-shaped handle 339 extending from a free end of the locking portion 337.

Referring also to FIGS. 3-6, in the assembly of the second clip 33 and the pivotal seat 251, the second clip 33 is first brought to a position near the supporting rack 28 corresponding to the sidewall 23; and then the axle 335 is extended through the stopper 253 and received into the hole 2510 of the pivotal seat 251; finally, the second clip 33 is rotated downwardly with a predetermined angle apart from the supporting rack 28 until the second clip 33 is blocked by the stopper 253. As a result, the second clip 33 will not fall from the pivotal seat 251.

Figure 3:
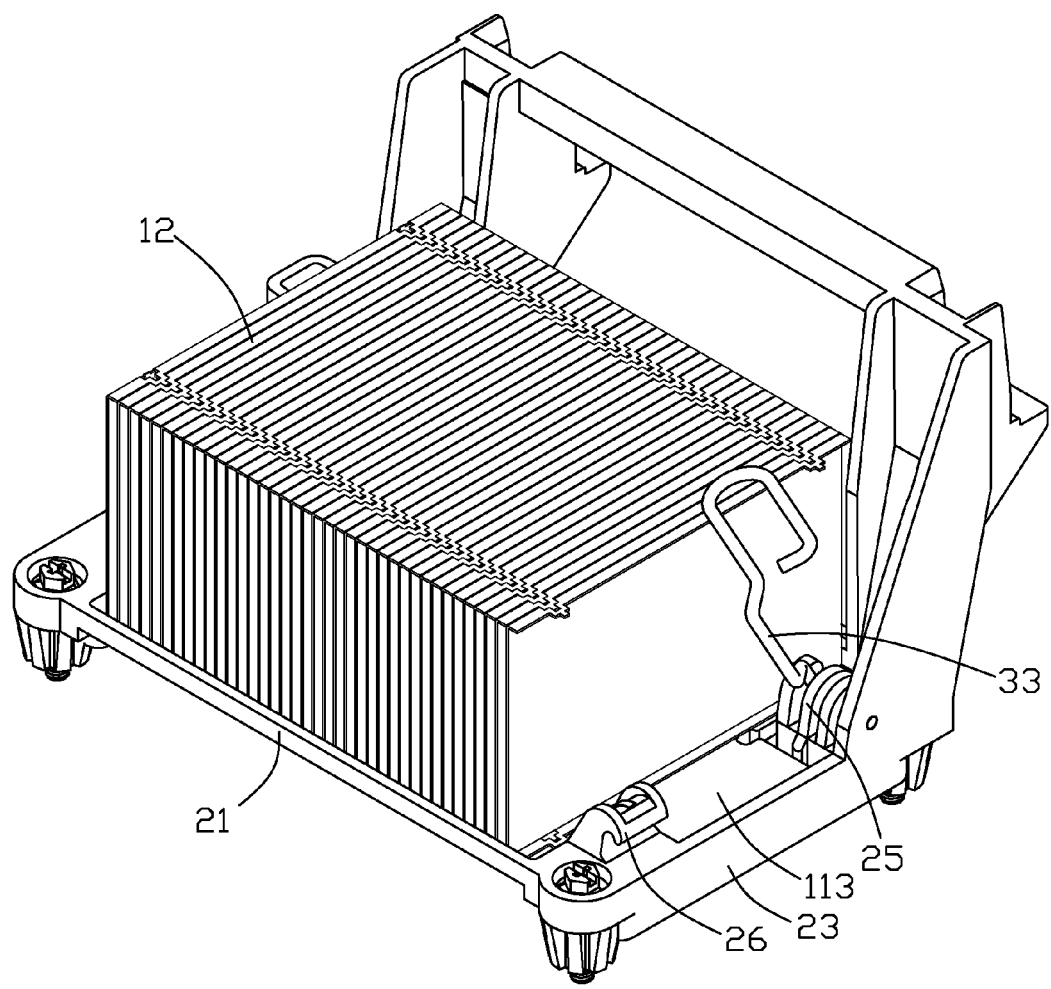
FIG. 3 is an assembled view of FIG. 1 with the heat sink assembly with a locking device in an unlocked position.
Figure 4:
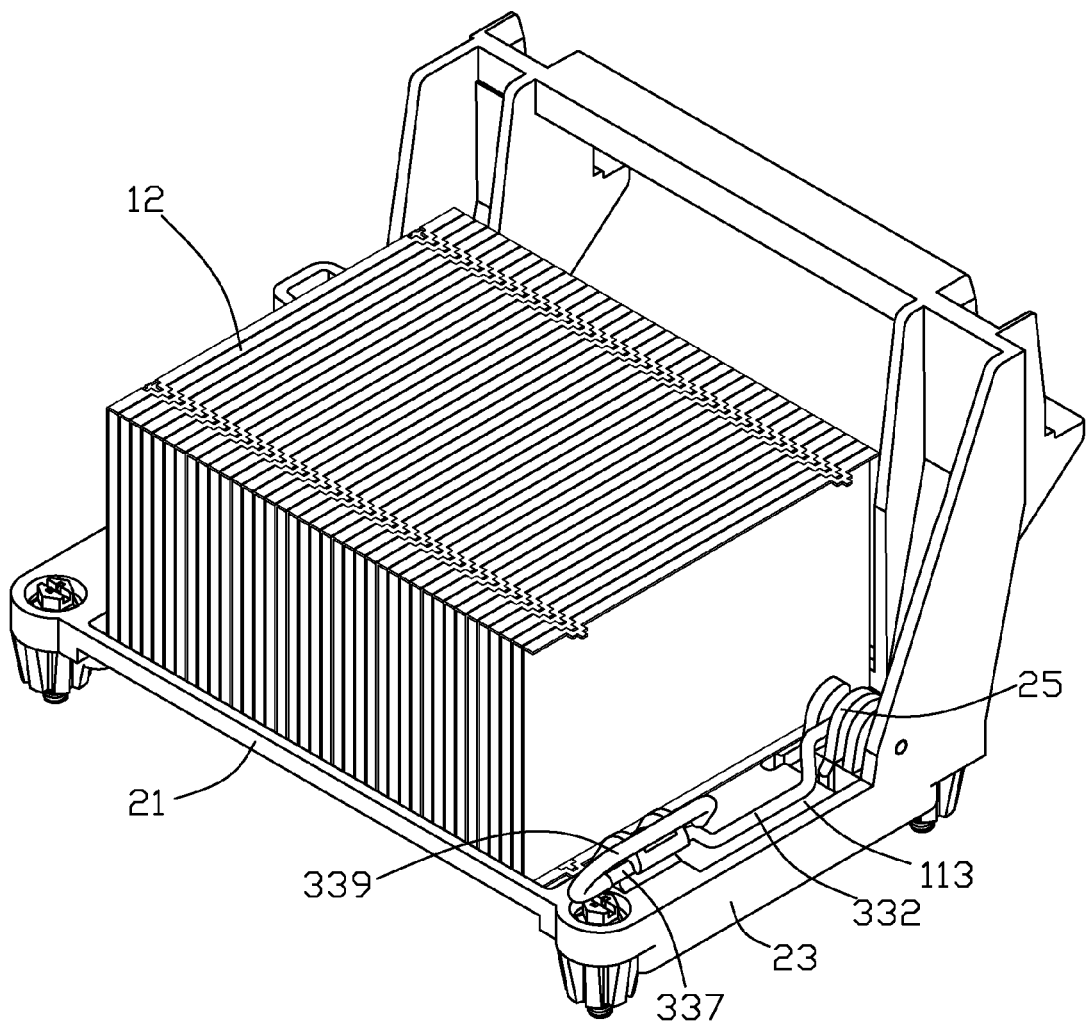
FIG. 4 is an assembled view of FIG. 1 with the heat sink assembly with a locking device in a locked position.
Figure 5:
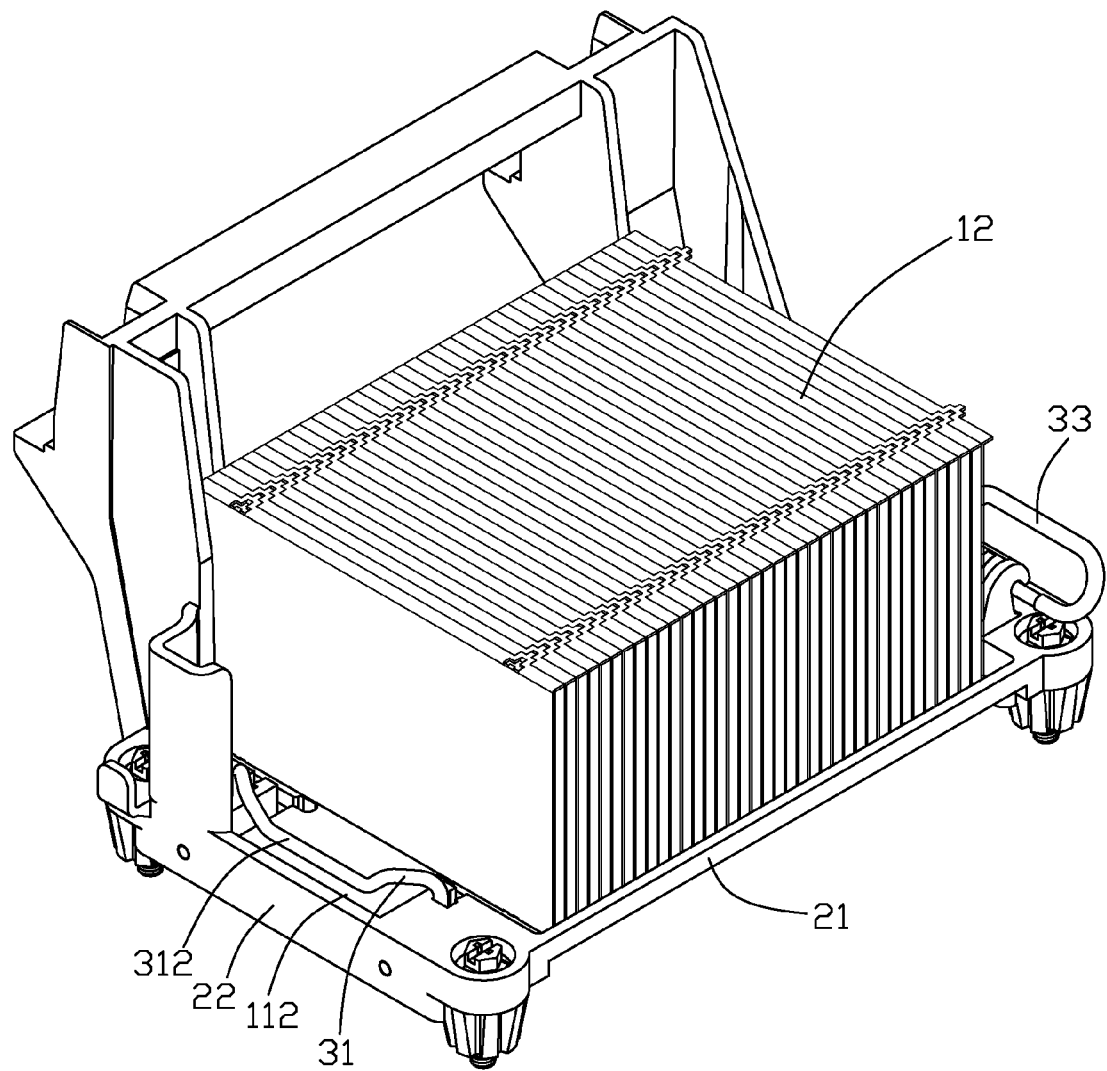
FIG. 5 shows the heat sink assembly with a locking device of FIG. 4 viewed from a different aspect.

In assembly, the heat sink locking device is located on the printed circuit board with the screws 80 extending through the locking feet 27 and the printed circuit board to engage with the back plate located under the printed circuit board. The first clip 31 engages with the sidewall 22 with the extension portions 314 being inserted into the receiving spaces 220, and the pressing portion 312 spans on the receiving portion 221. The second clip 33 rotatably engages with the pivotal seat 251 of the retention module 20 at an unlocked position as shown by FIG. 3. The heat sink 10 is placed on the retention module 20 with the base 11 contacting the electronic component and the shoulders 112, 113 of the heat sink 10 supported by the receiving portions 221, 231 of the retention module 20. The shoulder 112 is sandwiched between the receiving portion 221 and the pressing portion 312 of the first clip 31 so that the first clip 31 is deformed and the pressing portion 312 presses the shoulder 112 downwardly. The handle 339 of the second clip 33 is pressed downwardly that the second clip 33 rotates around the seat 25 until the locking portion 337 reaches and is retained in the retaining slot 260 of the block 26. The second clip 33 presses the shoulder 113 and is deformed. The pressing portion 332 is pivoted to a horizontal position and presses the corresponding shoulder 113 downwardly. By this, the second clip 33 is in a locked position as shown by FIGS. 4-6. Thus, the heat sink 10 is firmly secured to the retention module 20 via the first and second clips 31, 33, and has an intimate contact with the electronic component. Heat generated by the electronic component can be effectively absorbed by the heat sink 10.

When remove the heat sink assembly from the electronic component, the handle 339 is operated to cause the locking portion 337 to be released from the retaining slot 260 of the block 26. The pressing portion 332 is released from pressing the shoulder 113 of the heat sink 10. The shoulder 112 can be pulled out of the receiving portion 221 of the retention module 20 so that the heat sink 10 easily removes from the electronic component.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising: a heat sink for absorbing heat from an electronic component mounted on a circuit board, the heat sink having a first shoulder and a second shoulder at two lateral sides thereof; and a locking device comprising: a retention module having a first sidewall and a second sidewall opposite to the first sidewall, a pair of opposite receiving portions being formed on the first sidewall and the second sidewall of the retention module for receiving the corresponding first shoulder and second shoulder of the heat sink, a vertical hole and a horizontal hole located on each of one of the receiving portions; first wire clip having two extension portions at two ends thereof and non-rotatably engaged with the vertical and horizontal holes, and a pressing portion between the two extension portions and pressing the first shoulder of the heat sink; a second clip comprising a pressing portion located on the second shoulder of the heat sink, an axle connecting with the pressing portion and pivotably engaging with the second sidewall of the retention module and a locking portion connecting with the pressing portion; wherein the second clip can rotate around the axle thereof, and the locking portion of the second clip engages with the retention module and the pressing portion of the second clip presses the second shoulder of the heat sink toward the retention module when the heat sink assembly is in a locked position; wherein the retention module comprises two supporting racks extending upwardly from an end of each sidewall; and wherein supporting racks each extend a supporting platform for cooperatively supporting another electronic device thereon.

2. The heat sink assembly as claimed in claim 1, wherein the second sidewall of the retention module extends a seat receiving the axle of the second clip and a block engaging with the locking portion of the second clip when the heat sink assembly is in the locked position.

3. The heat sink assembly as claimed in claim 2, wherein the seat comprises a pivotal seat and a stopper at a front end of the pivotal seat, the stopper blocking the second clip to prevent the second clip from falling from the pivotal seat when the heat sink assembly in an unlock position.

4. The heat sink assembly as claimed in claim 1, wherein the pressing portion of the first clip is U-shaped and elastic.

5. The heat sink assembly as claimed in claim 1, wherein the extension portions each are L-shaped.

6. The heat sink assembly as claimed in claim 1, wherein the locking portion of the second clip extends a P-shaped handle at a free end thereof.

7. The heat sink assembly as claimed in claim 1, wherein the first shoulder of the heat sink extends from a middle portion of a lateral side of a base of the heat sink, and has a width less than that of the base.

8. The heat sink assembly as claimed in claim 7, wherein the second shoulder of the heat sink extends from a middle portion of an opposite lateral side of the base of the heat sink, and has a width less than that of the base.

9. The heat sink locking device as claimed in claim 1, wherein a beam connects with two upper ends of the supporting racks.

10. The heat sink locking device as claimed in claim 1, wherein each of the supporting racks comprises a vertical base plate and two parallel ribs connecting with the base plate and the supporting platform.

11. A heat sink locking device for securing a heat sink on an electronic component mounted on a circuit board, comprising: a retention module comprising a plurality of sidewalls having a first sidewall and a second sidewall opposite to the first sidewall, a pair of opposite receiving portions being formed on the first and second sidewalls of the retention module for receiving lateral sides of the heat sink, a vertical hole and a horizontal hole located on each side of one of the receiving portions, two supporting racks extending upwardly from the retention module, the supporting racks being adapted for cooperatively supporting an electronic device thereon; a first wire clip with two extension portions which non-rotatably engage with the vertical and horizontal holes for securing a lateral side of the heat sink on the retention module; and a second clip for securing another lateral side of the heat sink on the retention module; wherein the second clip is pivotable between an unlocked position in which the heat sink is removable from the retention module and a locked position in which the second clip presses the heat sink; wherein the two supporting racks extend upwardly from an end of each of the sidewalls of the retention module; and wherein each of the supporting racks extends a supporting platform in a direction away from the heat sink, the supporting platforms being adapted for supporting another electronic device thereon.

12. The heat sink locking device as claimed in claim 11, wherein a beam connects with two upper ends of the supporting racks.

13. The heat sink locking device as claimed in claim 11, wherein each of the supporting racks comprises a vertical base plate and two parallel ribs connecting with the base plate and the supporting platform.

* * * * *